United States Patent [19] [11] 4,428,811
Sproul et al. [45] Jan. 31, 1984

[54] RAPID RATE REACTIVE SPUTTERING OF A GROUP IVB METAL

[75] Inventors: William D. Sproul, Palatine; James R. Tomashek, Wood Dale, both of Ill.

[73] Assignee: Borg-Warner Corporation, Chicago, Ill.

[21] Appl. No.: 481,953

[22] Filed: Apr. 4, 1983

[51] Int. Cl.$^3$ ............................................. C23C 15/00
[52] U.S. Cl. ................................ 204/192 R; 204/298
[58] Field of Search ............................ 204/298, 192 R

[56] References Cited

U.S. PATENT DOCUMENTS

| | | | |
|---|---|---|---|
| 3,616,405 | 10/1971 | Beaudry | 204/192 |
| 3,632,494 | 1/1972 | Herte et al. | 204/192 |
| 3,734,620 | 5/1973 | Cade | 204/298 |
| 3,738,926 | 6/1973 | Westwood et al. | 204/192 |
| 4,036,167 | 7/1977 | Lu | 118/7 |
| 4,043,889 | 8/1977 | Kochel | 204/192 R |
| 4,124,474 | 11/1978 | Bomchil et al. | 204/192 R |
| 4,166,783 | 9/1979 | Turner et al. | 204/192 R |
| 4,166,784 | 10/1979 | Chapin et al. | 204/192 R |
| 4,172,020 | 10/1979 | Tisone et al. | 204/192 R |
| 4,201,645 | 5/1980 | Riegert | 204/192 R |
| 4,283,260 | 8/1981 | Thomas et al. | 204/192 R |
| 4,336,119 | 6/1982 | Gillery | 204/192 R |
| 4,379,040 | 4/1983 | Gillery | 204/192 R |
| 4,379,743 | 4/1983 | Nakasukasa et al. | 204/298 |

OTHER PUBLICATIONS

Coburn et al., J. Appl. Phys. (45) #4, 1974, pp. 1779-1786.
Greene et al., J. Vac. Sci. Technol. (10), 1973, pp. 1144-1148.
Greene, J. Vac. Sci. Technol. 15, 1978, pp. 1718-1726, 203-204.
Steinbrüchel et al., J. Vac. Sci. Technol. 16 (1979), pp. 251-254.

*Primary Examiner*—Arthur P. Demers
*Attorney, Agent, or Firm*—James A. Geppert

[57] ABSTRACT

A metal from group IVb of the periodic table is used as the target in a reactive deposition process. An inert gas such as argon is admitted within the chamber housing the target. Electrical power at a constant level is supplied to the target, ionizing the inert gas so that the ions bombard the metal target and initiate sputtering. A controlled flow of a reactive gas such as nitrogen is then admitted to the chamber and controlled in such a way that the metal deposition rate is not lowered. The amount of the reactive gas is constantly sampled to provide a control signal used to regulate admission of the reactive gas at the proper rate for most effective deposition of the metal onto the substrate. Closed loop systems regulate the level of electrical power supplied to the target, rate of admission of the inert gas, and rate of admission of the reactive gas.

16 Claims, 10 Drawing Figures

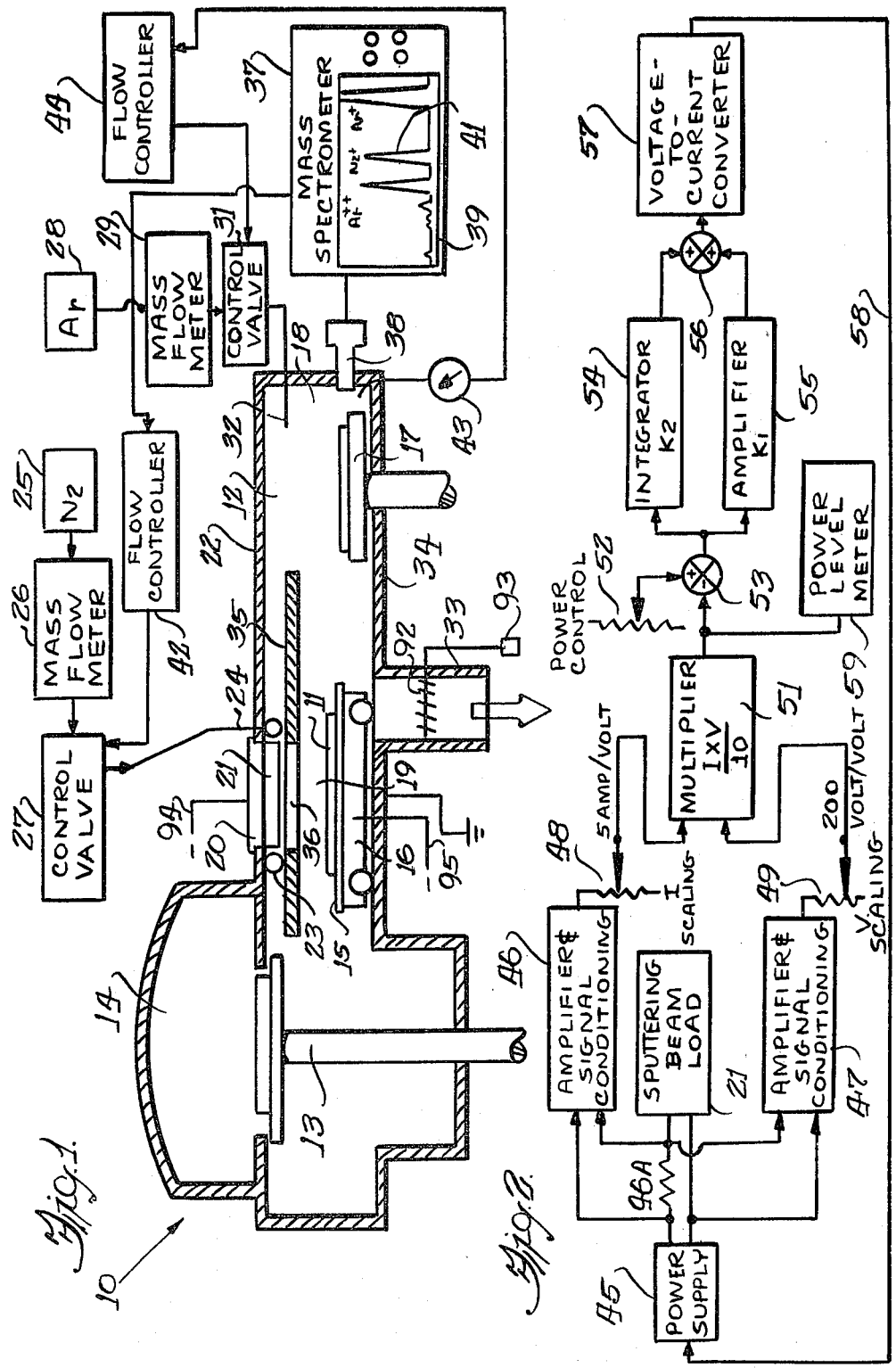

RAPID RATE REACTIVE SPUTTERING OF A GROUP IVB METAL

BACKGROUND OF THE INVENTION

The present invention relates to the rapid rate reactive sputtering of titanium and like metallic nitrides onto a substrate or workpiece. The field of this invention comprises substrate coating by cathodic magnetron sputtering and includes a substrate to be coated, a coating material mounted on a target plate, electrode plates causing gas plasma particles to strike the target to release the coating material, means to control the rate of deposition of the coating material, and means to carry the article to be coated and to expose the desired portions for coating. The prior methods for coating substrates with thin metallic films have been accomplished by vapor deposition, plasma spray processes and cathode sputtering.

Vapor deposition processes to provide a metallic thin film on a workpiece utilize the material to be plated which is heated in a suitable atmosphere, such as in a vacuum or an inert shielding gas, to such an extent that the material evaporates and is deposited as a film on a substrate. Plasma spray processes provide the material to be deposited as a fine-grained powder which is brought into a plasma arc so that the particles melt and are deposited on a substrate.

Cathode sputtering or radio-frequency ionic sputtering involves a target of the material to form the coating in a gas discharge wherein the material is sputtered by ion bombardment; the particles removed from the target being deposited on the substrate. The target becomes the cathode and an anode is located beyond the substrate. Thus particles moving from the cathode toward the anode strike the substrate. Where a thin film of metallic compounds, such as the oxides, nitrides, carbides and the like, are to be deposited on various substrates, reactive sputtering is used wherein the target consists of the metal for the plating compound. A neutral gas, such as argon, is mixed with a reactive gas such as oxygen, nitrogen or methane. The particles that are dislodged from the target combine with the reactive gas to produce the desired compound which is plated on the substrate or workpiece.

A major problem in the sputtering process is an abrupt decrease in the deposition rate of metallic films during the sputtering process in a reactive gas atmosphere. The deposition rate using a reactive gas was found to be 10 to 20% of the rate for the deposition of pure metal in a neutral gas. One method developed to increase the deposition rate for reactive sputtering of titanium nitride is by the "pulsing" of the nitrogen gas, that is, admitting the gas in successive, controlled volumes. In this method the gas is admitted to the chamber for a pulse duration of 2 to 3 seconds and then shut off for 2 to 3 seconds. Using this pulsing technique, the nitride film deposition rate was increased substantially to approximately 50% to 70% of the deposition rate of the pure metal. The present invention expands on this pulsing technique to provide a continuous flow of the reactive gas, as contrasted to a pulsed or intermittent flow, and further enhance the nitride deposition rate to achieve substantially 100% of a deposition rate of the pure metal.

SUMMARY OF THE INVENTION

The present invention comprehends the provision of a novel control system for reactive sputtering of metallic compounds on a substrate wherein the deposition rate approaches or equals the deposition rate of the pure metal. To improve the deposition rate, the partial pressure of the reactive gas is sensed through a mass spectrometer to develop a signal for regulating a gas flow control valve to govern action to maintain a constant partial pressure of the reactive gas relative to the inert atmosphere in the sputtering chamber.

The present invention also comprehends the provision of a novel control arrangement for reactive sputtering wherein the power supplied to the target material is maintained at a substantially constant level during the deposition cycle.

Further objects, features and advantages of the present invention will be better appreciated when the following detailed description of an embodiment thereof is taken in conjunction with the accompanying drawings.

DESCRIPTION OF THE DRAWINGS

FIG. 1 is a cut-away and block diagram showing of a sputtering apparatus utilized for the present invention.

FIG. 2 is a block diagram for the power supply control system.

DESCRIPTION OF THE PREFERRED EMBODIMENT

Figure 3:
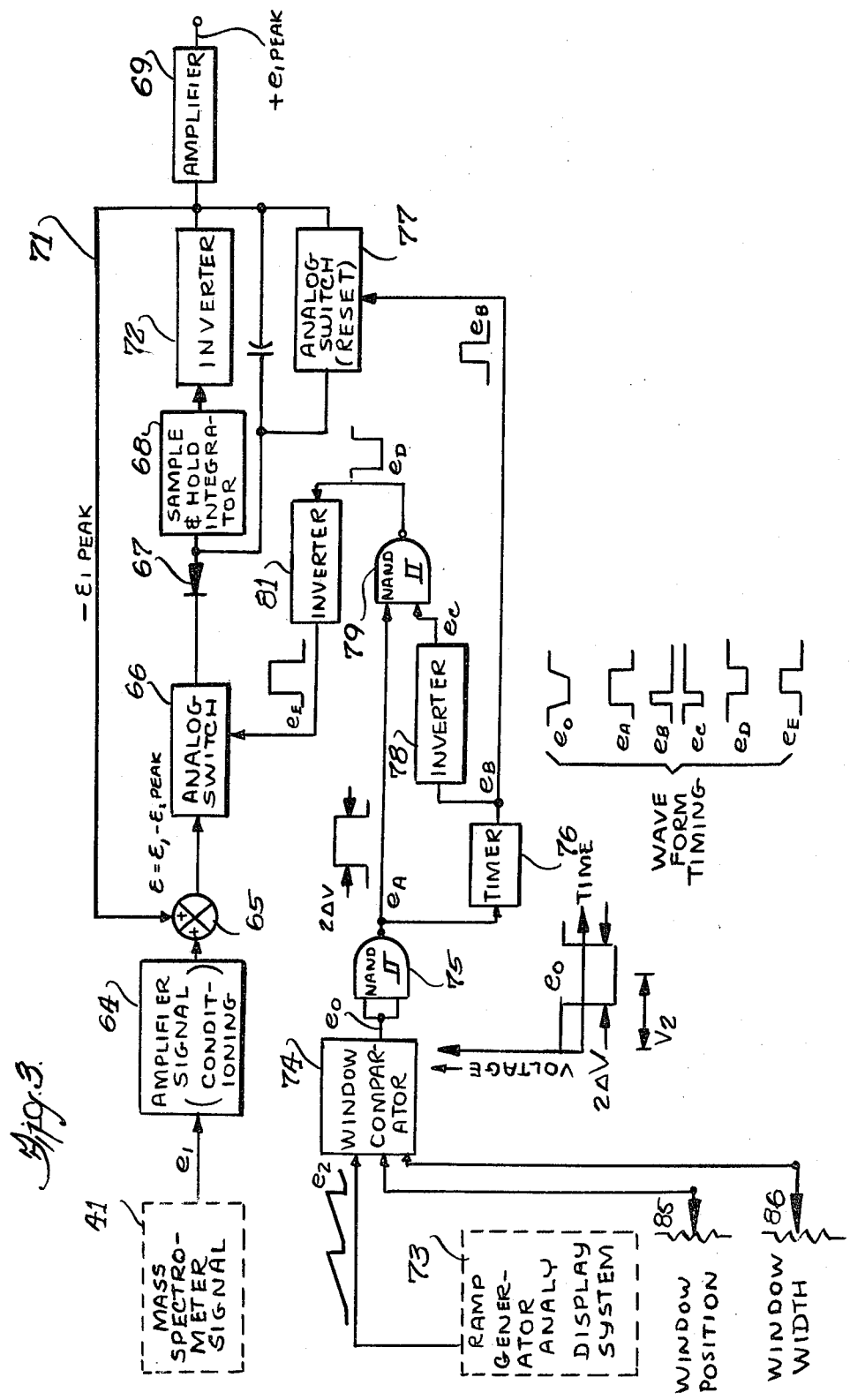
FIG. 3 is a block diagram, partly in schematic form, for the control system for the reactive gas supply.

Referring more particularly to the disclosure in the drawing wherein is shown an illustrative embodiment of the present invention, FIG. 1 discloses a reactive sputtering apparatus 10 for the plating of a thin film of titanium nitride (TiN) or other similar metal of the group IVb metals in the form of oxides, nitrides or carbides on a suitable substrate 11. At this time the group IVb metals are titanium, zirconium, and hafnium. The apparatus includes an elongated chamber 12 having an elevator 13 at one end communicating with a domed loading/unloading chamber 14, a pallet 15 which is carried by the elevator to receive the substrate 11 to be coated, a pallet carrier 16 receiving the pallet from the elevator and moving the pallet into the chamber 12 for sputtering in the central portion 19 and/or etching on a platform 17 at the end 18 of the chamber opposite to the elevator.

A target 21 formed of the group IVb metal, such as titanium, is located at a position on the upper wall 22 of the chamber 12, in contact with cathode plate 20. Target 21 occurs in one of two forms: (1) a generally rectangular block of material to be deposited, or (2) a generally rectangular ring formed of four blocks of material clamped together, which is sold under the trademark Inset. A substantially rectangular ring of tubing 23 having a plurality of openings therein directed downwardly and inwardly for a purpose to be later described is positioned encompassing the periphery of the target. The tubing ring is connected through an inlet 24 in the upper wall for communication with a source 25 of a reactive gas, such as nitrogen. The gas source is connected to the inlet 24 through a mass flow meter 26 and a control valve 27. Operation of control valve 27 is regulated by a flow controller 42, connected between valve 27 and the output connection of a mass spectrometer 37.

A source 28 of an inert gas, such as argon, communicates, through a second mass flow meter 29, another control valve 31, and a conduit 32, which extends through end wall 18, into chamber 12. Also, an outlet 33 in the floor 34 of the chamber 12 is connected to a vacuum system (not shown) for evacuation of the chamber prior to, and during, etching and sputtering. A throttle 92, similar in form and operation to a metallic venetian blind structure, is positioned in outlet 33 and is regulated by throttle control valve 93. A horizontally movable shutter plate 35 having an opening or shutter 36 is positioned below the target 21 to prevent any substantial scattering of material onto other parts of the chamber, thus directing the material onto the substrate below the shutter.

Vacuum is continuously applied to chamber 12, and the vacuum system draws all air and other contaminants from chamber 12 through outlet 33, so that chamber 12 is in a high vacuum. The vacuum system remains on at all times. To initiate the coating cycle, the elevator 13 is raised with a pallet 15 into the domed chamber 14 wherein a substrate 11 is loaded onto the pallet and the chamber 14 is sealed. The elevator is lowered and the pallet with the substrate is transferred onto the carrier 16. The empty elevator is raised to seal the domed chamber 14 from the main processing chamber 12. The system is throttled by actuating valve 93 to close shutter 92. Argon gas is admitted through the flow meter 29, control valve 31, and conduit 32 to the chamber 12, to backfill the chamber with a partial pressure of argon. The carrier 16 moves to the chamber end 18 and deposits the substrate on the etch platform 17. A potential is applied to the substrate and the argon gas ionizes, providing argon ions which bombard the substrate to clean the surface to be coated.

Once cleaned, the potential is removed and the carrier 16 returns to pick up the substrate and move it beneath the target 21. The shutter plate 35 is shifted laterally, if required, to align the opening 36 between the target and the substrate. Nitrogen gas is then admitted through mass flow meter 26, control valve 27, inlet 24 and tubing ring 23. A negative potential relative to a reference (or ground) potential, is applied over conductor 94 to cathode 20, which is in contact with the target 21, whereupon the argon gas is ionized and the argon ions then bombard the titanium and dislodge titanium atoms. Target 21 abuts plate 20, to which a negative potential is applied. This potential is in the range of −450 to −500 volts, and the bias voltage applied over conductor 95 to the substrate is approximately −100 volts. The titanium atoms pass through the shutter 36, and react with the nitrogen gas being discharged from the ring 23 to form titanium nitride on the cleaned substrate 11 and not on the target surface. Deposition may occur in two ways on the substrate. If the substrate is stationary beneath the opening 36, the titanium nitride deposition will take the general outline of the shutter opening. In the alternative, the substrate may be moved or scanned under the target past the shutter to provide an even deposition of the titanium nitride on the entire surface of the substrate. The same result can be provided by maintaining the substrate fixed and moving the shutter.

The pressure of the argon gas is initially adjusted to a substantially constant value of 8.0 millitorr. Flow controller 44 is adjusted to regulate operation of control valve 31 to maintain the desired pressure. The input of controller 44 is connected, through a pressure gauge 43, to the interior of chamber 12. Admission of the nitrogen gas is controlled by operation of the control valve 27, which in turn is governed by a flow controller 42, in its turn regulated by a signal from a mass spectrometer 37 connected to chamber 12 by a sampling tube 38 at the end 18 of the chamber. Particularly in accordance with the invention, to achieve a rate of deposition of titanium nitride that is substantially 100% of the deposition rate of the pure metal, the partial pressure of the nitrogen gas is controlled by an electrical signal represented visually as peak 41 on the mass spectrometer screen 39. This signal represents the maximum value of the nitrogn, by percentage of the mixture within chamber 12, at the time of sampling. Hence this signal is termed the "nitrogen peak" signal. Once the desired thickness of the titanium nitride layer has been achieved, the potential applied over plate 20 to the target 21 is interrupted and the pallet 15, carrier 16 and substrate 11 are moved back to the elevator 13 so that the coated substrate can be removed through the domed chamber 14. Obviously, with proper entrance and exit chambers at the ends of the sputtering chamber to prevent contamination of the gas during deposition, the batch process enumerated above could be easily transformed into a continuous process for reactive sputtering of numerous substrates or workpieces in a line.

Also, as seen in Table I, the optimum flow of the nitrogen gas through the control valve 27 will vary with the power applied to the target 21. Thus, at a constant value of power applied to the target, the nitrogen flow is adjusted to the optimum rate, and the flow is then varied depending on the signal to the mass spectrometer 37.

TABLE I

| Target Power, kW | N$_2$ Flow, sccm* |
|---|---|
| 1.0 | 4.0 |
| 2.0 | 8.1 |
| 3.0 | 12.9 |
| 4.0 | 18.1 |
| 5.0 | 23.5 |
| 6.0 | 29.4 |
| 7.0 | 35.3 |
| 8.0 | 40.6 |
| 9.0 | 45.8 |
| 10.0 | 50.4 |

*standard cubic centimeters per minute. If plotted on a graph, a straight line relationship is shown.

Considering the control circuit for the power supply to the target 21, FIG. 2 shows a power supply 45 for supplying energy to the cathode 20, that is, to the sputtering target. A current signal related to the load level is developed across resistor 46A and amplified by an isolation amplifier 46. A load-related voltage signal is passed to a second isolation amplifier 47. The amplified current-related and voltage-related signals are scaled to desired levels by adjustment of scaling devices or potentiometers 48 and 49, respectively. The scaled-down signals applied to a multiplier circuit 51, where the signals are multiplied to obtain a signal proportional to power level, and then divided by a factor of 10 to provide an output signal sensitivity of 10 kilowatts per volt. This signal is displayed on a meter 59.

A power level control device 52 provides a reference signal to a comparator 53 where the power reference signal is compared to the actual power signal from the multiplier 51; the difference or error signal is applied both to an integrator 54 and to an amplifier 55. The output signals from integrator 54 and amplifier 55 are fed to a summing circuit 56, which inverts the summed signal and passes its output to a voltage-to-curent converter 57, the output of which is returned via a feedback loop including conductor 58 to the power supply 45. The error signal on line 58 causes the output of power supply 45 to change in the proper sense to cause the error signal to be reduced to zero.

The control circuit for regulating the supply of nitrogen gas is shown in FIG. 3. FIG. 1 shows mass spectrometer 37 connected to the end wall 18 of the sputtering chamber 12 via a sampling tube 38, to determine the quantity of nitrogen gas fed to the chamber through control valve 27. With constant power supplied to the sputtering target 21, and a process for sputtering of titanium in an argon/nitrogen atmosphere, the height of the nitrogen peak signal 41 on the osciloscope screen 39 of the mass spectrometer will vary significantly with gas flow. The location where the sample of the sputtering atmosphere is taken makes a difference in the nitrogen peak signal height and, since it is very difficult to sample directly in the sputtering plasma, the mass spectrometer 37 really samples what is left over; i.e., the excess reactive gas. The amount of this excess reactive gas is proportional to the partial pressure of the reactive gas in the reaction zone. A control signal, related to the height of nitrogen peak signal 41, is passed to flow controller 42. This control signal, designated $e_1$, is passed to flow controller 42, the block diagram of which is depicted in FIG. 3.

Figure 4:
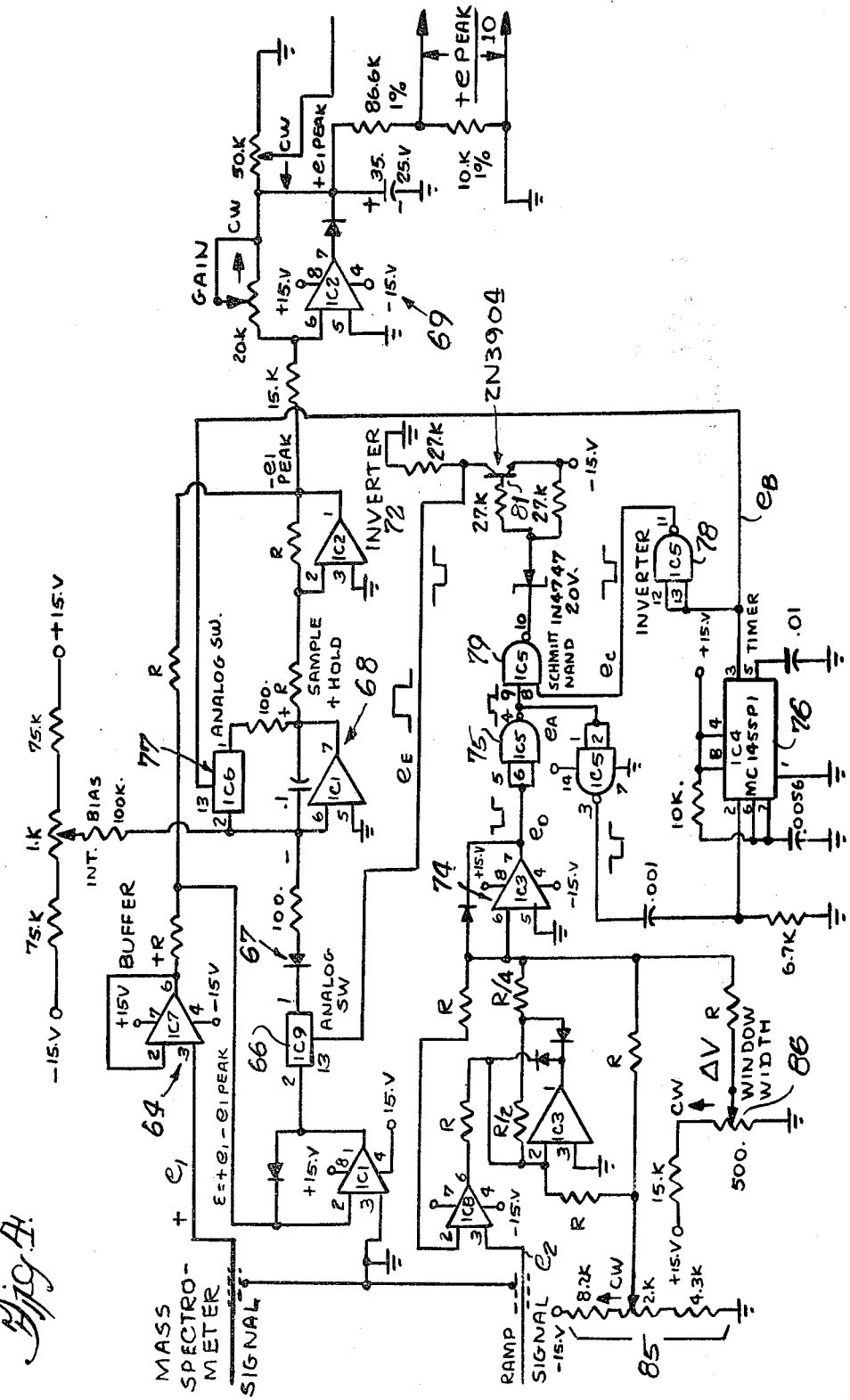
FIG. 4 is a schematic diagram setting out circuit details of the control system shown more generally in FIG. 3.

The circuit of FIGS. 3 and 4 may be considered an interface (or "circuit means" in certain of the claims) between the mass spectrometer and flow controller 42. This interface includes a first means 85 adjustable to regulate the position of the window signal $e_o$, and a second means 86 adjustable to regulate window width. Thus the interface receives the signals from the mass spectrometer and, by properly positioning the window, "captures" only the desired signal (related to the reactive gas) for regulating the flow controller.

As shown in FIG. 3, the signal $e_1$, which is derived from the mass spectrometer, is conditioned by amplifier 64 and applied to a summing junction 65, where the signal is added to the signal $-e_1$ peak, resulting in an error signal e. The error signal e is applied to an analog switch 66 which either passes the signal e through or blocks it, depending on a signal generated by timer 76. If the switch is "closed" (i.e., the gate is "open"), it passes the signal through a diode 67, which acts in combination with the sample-and-hold integrator 68 to retain the peak signal value. From the integrator 68, the signal $-e_1$ peak passes through inverter 72 to amplifier 69. The output of amplifier 69 is the signal $e_1$ peak, which is fed to flow controller 42, governing valve 27 to regulate the input of nitrogen to chamber 12. The signal $-e_1$ peak is also passed over conductor 71 to the summing point 65. While the analog switch is open and an error signal exists, the sample and hold integrator output increases so as to reduce the error signal to zero. The net effect is to produce an output signal equal to the instantaneous peak value attained by the input signal $e_1$ during the time interval that the gate is open.

A ramp generator 73 provides a sweep or sawtooth voltage $e_2$ every seventy-five milliseconds on the scope face 39 of the mass spectrometer 37. A window comparator circuit 74 provides an output pulse, or "window", which is utilized as an enabling pulse for the timer and analog switches. The window is adjusted to center on that portion of the sweep which includes the nitrogen peak signal 41. The ramp voltage $e_2$ is the same voltage which is used to "sweep" the beam across the screen 39. The "window" or position of this ramp voltage is selected by setting the movable arm of potentiometer 85, to establish a location voltage $V_2$. In effect this positions the center of the window with respect to the beginning of the entire sawtooth voltage $e_2$. Each "half" of the window is represented by a voltage V, and the entire window width (2 V) is set by adjustment of potentiometer 86. The result is that stage 74 provides a window signal $e_o$, shown graphically below nand stage 75. The signal $e_o$ from comparator 74 passes through a Schmitt nand gate 75, connected as an inverter, to provide a sharpened signal $e_A$ which is applied to a timer 76. The timer provides an output signal $e_B$ having the dual function of (1) resetting the sample-and-hold integrator 68, and (2) shutting off signal input to the sample-and-hold integrator during the reset interval. The signal $e_B$ from the timer goes both to an analog switch 77 for resetting sample-and-hold integrator 68, and through an inverter 78 providing a signal $e_C$ to a second nand gate 79, which also receives the signal $e_A$ from the first nand gate 75. The signal $e_D$ from the second nand gate 79 is passed through an inverter 81, resulting in signal $e_E$ being applied to the analog switch 66, enabling the gate. Thus the switch 66 gates the signal e through or not, depending on the signal level from the nand gate 79.

Thus, this control circuit senses the nitrogen partial pressure which is displayed as peak nitrogen signal 41 on the mass spectrometer screen, and the partial pressure circuit captures the nitrogen partial pressure peak signal, measures the peak signal height, holds this peak value until the next spectrometer sweep, and outputs this peak voltage value $e_1$ peak to the nitrogen gas flow controller 42, which compares this voltage or peak height to a desired set point and takes appropriate action to maintain a constant nitrogen partial pressure in the chamber 12.

FIG. 4 sets out the particular integrated circuits, component values, and operating voltage levels for implementing the system shown in block form in FIG. 3. Certain resistors are shown as "R" or "R/2", where the precise value is not important but the ratio between the resistors thus designated is important. The ion current signal $e_1$ and the ramp signal $e_2$ are shown at the left, correlating with the similar positions in FIG. 3, and the output signal $+e_1$ peak also corresponds to that shown in FIG. 3. By following the schematic diagram, even those not skilled in the art will be able to readily implement the invention. Circuit details for the power supply arrangement of FIG. 2 are not shown, as many such power supplies are readily available. IC4 is identified on FIG. 4, and the various other integrated circuits (referenced "IC") in FIG. 4 are identified below:

IC1, IC2 and IC3: MC1458CP1
IC5: CD4093B
IC6 and IC9: CD4016B
IC7 and IC8: CA3140E Referring to FIG. 5, a graph is shown plotting the excess reactive gas peak signal height versus the amount of reactive gas flow through the control valve 28. Initially as the reactive gas is added to the chamber, the reactive gas signal peak is low, such as shown as point A on the lower curve portion; most of the reactive gas being consumed in the reactive sputtering and little gas is left over. At this stage, the deposition rate of the reactive product equals the deposited rate of the metal. A cross section through a portion of the target 21 (FIG. 6A) shows a very small amount of titanium nitride 90 at the outer edges of the target.

As more gas is added, the excess gas peak signal height will increase slightly until at point B, it begins to rise very quickly. As shown in FIG. 6B, the surface of target 21 is rapidly being covered with a layer 90a of the compound which sputters at a much lower rate than does the metal. With a very small increase in excess gas, the curve of FIG. 5 rises quite sharply at point C, and a substantial portion of the target surface is covered with a layer 90b of the compound (FIG. 6C). Thus, less reactive gas is required, and the amount of excess gas increases rapidly. At point D on the curve, the target surface is completely covered by the compound 90c (FIG. 6D), and the amount of excess reactive gas is very high. As seen in FIG. 6D, the window 89 of FIG. 6C is completely closed. Therefore, the sputtering rate at point D is very low compared to the metal deposition rate.

Figure 5:
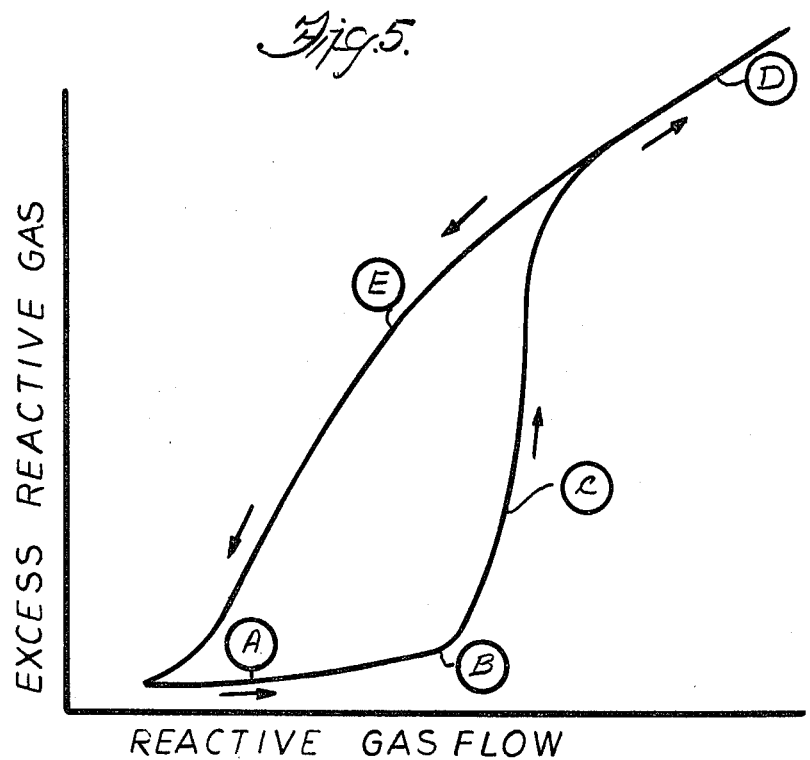
FIG. 5 is a graph showing a hysteresis curve for the reactive gas flow versus the excess reactive gas in the sputtering chamber.
Figure 6A:
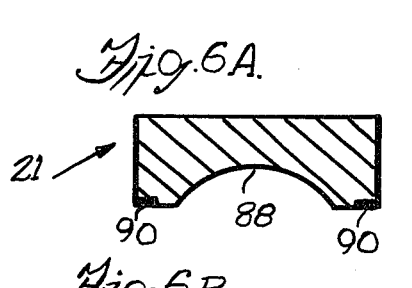
FIGS. 6A through 6E illustrate the metallic target at various levels of the excess reactive gas affecting the deposition rate of the metal.
Figure 6B:
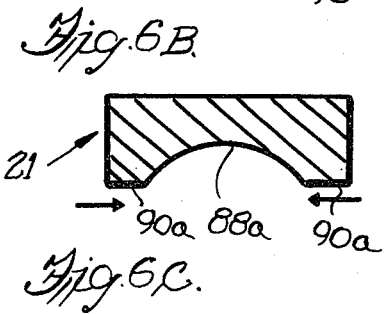
Figure 6C:
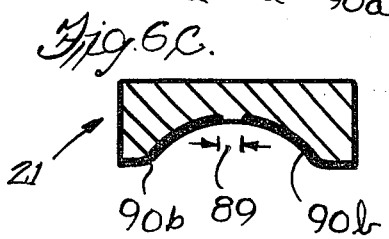
Figure 6D:
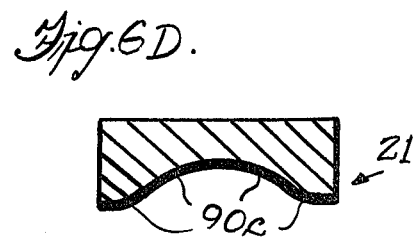
Figure 6E:
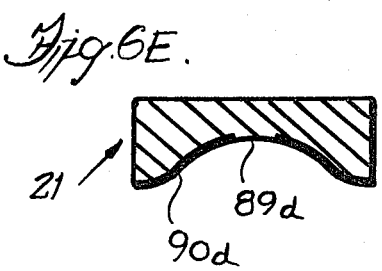

If the gas flow is reduced, the excess reactive gas peak does not follow the same path as it did when it increased, and a hysteresis curve is produced as seen in FIG. 5. Not until the compound 90d on the surface of the target is broken through (FIG. 6E) at 89d, or at the point E on the curve, does the amount of excess reactive gas drop down rapidly. When it does, the sputtering rate for the compound then returns to that of the metal.

The composition of the reaction product also varies as the amount of the reactive gas is varied. Initially the product is a solid solution of the reactive gas in the metal. As more gas is added, the compound begins to form, but in a substoichiometric form ($TiN_x$). At point B on the curve, the product is very close to stoichiometric (TiN), while at point C, the product is rich with the reactive gas. Thus, while it is desirable to operate at point B on the curve, it is very difficult to operate there because of the unstable nature of the curve at that point.

It has been discovered, though, that if the power to the target is kept constant, and if the total system gas pressure is also constant, then it is possible to operate just below point B by maintaining the excess gas peak signal height at a fixed value. With an uninterrupted gas flow, it is very difficult to keep a constant peak signal height manually, but with a closed loop feedback control system, it is possible to maintain a constant peak height. This feedback system measures the amplitude of the reactive gas signal peak 41 on the mass spectrometer screen 39 and feeds this signal to the gas controller, which then controls the feed rate of the reactive gas at the desired set point.

As examples of the deposition rates accomplished utilizing the present control system, for a target power of 6.0 kilowatts and a scanning rate of approximately 10 inches per minute for any of the three group IVb metals, a coating thickness of approximately 3000 to b 4000 angstroms (A°) is applied to a substrate. On the other hand, with a stationary substrate, the average deposition rate for titanium nitride was 5000A° per minute at 10 kilowatts (kw) target power. For zirconium nitride, the rate was 4360A° per minute at 8.0 kw, and hafnium nitride had a rate of 2950A° per minute at 5.0 kw target power.

Technical Advantages

Operation at or near point B on the hysteresis curve has two distinct advantages. First the composition of the coating is constant, and is at or very close to the stoichiometric value. Secondly, the deposition rate of the compound is equal to the pure metal deposition rate. This high deposition rate and control of stoichiometry works for the reactive sputtering of all of the group IVb elements in an argon/nitrogen controlled atmosphere. Thus, high rate deposition and controlled stoichiometry is achieved with the reactive sputtering of titanium nitride, zirconium nitride and hafnium nitride. In demonstrating the efficacy of the invention, coated cutting tools have shown a useful life 3 to 4 times that of conventional uncoated cutting tools. The same improvement should be realized with saw blades, drill bits, and similar devices coated in accordance with the inventive teaching.

The invention as described above was practiced using a Materials Research Corporation (MRC) 902-M apparatus as the apparatus 10. The MRC apparatus included both DC and RF magnetron, RF etch, and DC bias capabilities. Targets of titanium, zirconium, and hafnium were MRC VP grade materials. TiN was reactively sputtered from both Inset and bonded planar targets, ZrN from a zirconium Inset target, and HfN from a bonded planar hafnium target. HfN has also been reactively sputtered from a Research S-Gun which was adapted to the MRC machine. Target to substrate distance was three inches. Both the argon and the nitrogen were 99.999% pure. Flow controllers 42, 44 were MKS Type 260 flow controllers. The spectrometer 37 was a UTi (Uthe Technology International) Model 100C mass spectrometer.

In the appended claims the term "connected" means a d-c connection between two components with virtually zero d-c resistance between those components. The term "coupled" indicates there is a functional relationship between two components, with the possible interposition of other elements between the two components described as "coupled" or "intercoupled".

While only a particular embodiment of the invention has been described and claimed herein, it is apparent that various modifications and alterations of the invention may be made. It is therefore the intention in the appended claims to cover all such modifications and alterations as may fall within the true spirit and scope of the invention.

What is claimed is:

1. A process for the effective, rapid rate reactive deposition of a metallic compound in a chamber, using a metal from group IVb of the periodic table, including the steps of:

evacuating the chamber and then filling the chamber with an inert gas, providing a target of the metal to be deposited in the chamber, positioning a substrate to be coated in the chamber below the target, admitting into the chamber a second gas adapted to react with the metal of the target, applying electrical power to the target to ionize the inert gas and bombard the target with the gas ions to initiate sputtering, controlling the level of electrical power supplied to the target to be substantially constant, sensing the composition of the gases in the chamber and providing a control signal related to the amount of said second gas in the chamber, and regulating the admission of said second gas to the chamber in accordance with said control signal.

2. A control system for regulating the reactive deposition of a metallic compound, comprising:

a sealed chamber, having an access port;

a substrate positioned within the chamber;

a target of the metal to be deposited, positioned within the chamber and spaced from the substrate;

a first control system connected to regulate the admission of an inert gas into the chamber;

a second control system, connected to regulate the admission of a reactive gas into the chamber, for reaction with the target metal;

means for supplying electrical power at a constant level to the target metal, to ionize the inert gas and bombard the target with the gas ions thus produced to initiate sputtering; and means, coupled between the chamber and the second control system, for sensing the composition of the gases in the chamber to provide a control signal which varies as a function of the amount of the reactive gas in the chamber, and for regulating operation of the second control system in accordance with said control signal.

3. A control system as claimed in claim 2, and in which means is provided for applying a potential to the substrate with respect to the potential of the target metal.

4. A control system as claimed in claim 2, and furthr comprising a shutter defining an opening therein, which shutter is positioned between the target and the substrate to assist in directing the movement of sputtered metal from the target toward the substrate.

5. A control system as claimed in claim 4, in which said shutter and said substrate are relatively movable during the deposition process.

6. A control system as claimed in claim 2, in which the means for supplying electrical power includes means for sensing both the current level and the voltage level of the power supplied to the target, and for providing an indication of actual power supplied to the target.

7. A control system as claimed in claim 6, in which the means for supplying electrical power further comprises means for comparing the actual power supplied to the target with a desired power delivery level, and for regulating the actual power supplied to the target as a function of an error signal derived from the comparison of the actual and desired power levels.

8. A control system as claimed in claim 2, in which the means for sensing the composition of the gases in the chamber is a mass spectrometer which provides said control signal, and further comprising an adjustable circuit coupled to the mass spectrometer for providing a specific peak signal from the various signals initially provided by the mass spectrometer.

9. A control system as claimed in claim 8, and in which the specific signal selected is that denoting the amount of reactive gas in the chamber, and a flow controller is provided and regulated as a function of said specific signal to continually control the admission of the reactive gas, to maintain sputtering of the metal onto the substrate at a rate approaching that of the metal itself.

10. A processing system for regulating the reactive deposition of a metallic compound, comprising:

a sealed chamber, having an access port;

a substrate positioned within the chamber;

a target, formed of the metal to be deposited, positioned within the chamber and spaced from the substrate;

a first control system, including a first control valve, connected to regulate the passage of an inert gas from a supply location through the control valve into the chamber;

a second control system, including a second control valve, connected to regulate passage of a reactive gas from a source through the second control valve into the chamber;

a power supply, connected to transfer electrical power at a constant level to the target metal, to ionize the inert gas and bombard the target with the gas ions thus produced and thereby initiate sputtering of the target metal;

a mass spectrometer, coupled to the chamber, for sensing the composition of the gases in the chamber and providing a plurality of signals which vary in relation to the amounts of said gases; and circuit means, coupled between the mass spectrometer and said second control valve, for providing a window straddling the signal denoting the amount of reactive gas in the chamber, and utilizing the signal centered in the window to regulate continuous admission of the reactive gas into the chamber during the sputtering process in such a way that the metal deposition rate is not lowered.

11. A processing system as claimed in claim 10, in which said circuit means includes a first means adjustable to regulate the position of the window, to ensure capture of the signal denoting the amount of reactive gas in the chamber.

12. A processing system as claimed in claim 11, in which said circuit means includes a second means adjustable to regulate the width of the window.

13. A method of controlling the effective, rapid rate reactive deposition of a group IVb metallic compound onto a substrate in a chamber, comprising the steps of maintaining a constant power level to the metallic target, sampling the excess reactive gas in the chamber, and selecting the appropriate reactive gas flow based on the excess reactive gas measurement to provide optimum deposition.

14. A method of controlling deposition as set forth in claim 13, in which a graph of excess reactive gas in the chamber versus the reactive gas flow results in a hysteresis curve.

15. A method of controlling deposition as set forth in claim 14; in which a point on the curve for a low excess reactive gas level provides deposition of a substantially stoichiometric metallic compound on the substrate.

16. A method of controlling deposition as set forth in claim 15, in which a low excess reactive gas level will provide little coating of the target with the metallic compound.

* * * * *